(12) United States Patent
Lee et al.

(10) Patent No.: US 8,426,934 B2
(45) Date of Patent: Apr. 23, 2013

(54) MICRO-ELECTRO-MECHANICAL SYSTEM DEVICE AND METHOD FOR MAKING SAME

(75) Inventors: Sheng Ta Lee, HsinChu (TW); Chuan Wei Wang, HsinChu (TW)

(73) Assignee: Pixart Imaging Incorporation, Hsin-Chu (TW)

( * ) Notice: Subject to any disclaimer, the term of this patent is extended or adjusted under 35 U.S.C. 154(b) by 0 days.

(21) Appl. No.: 13/178,121

(22) Filed: Jul. 7, 2011

(65) Prior Publication Data
US 2011/0260268 A1 Oct. 27, 2011

Related U.S. Application Data

(62) Division of application No. 12/217,732, filed on Jul. 8, 2008, now Pat. No. 8,003,422.

(30) Foreign Application Priority Data

Apr. 30, 2008 (TW) ............................. 97115834 A

(51) Int. Cl.
*H01L 29/84* (2006.01)

(52) U.S. Cl.
USPC ............................................ 257/416; 438/53

(58) Field of Classification Search ........... 257/E29.324, 257/E21.499, 414–419; 438/53, 48–52
See application file for complete search history.

(56) References Cited

U.S. PATENT DOCUMENTS

| 5,490,220 | A | 2/1996 | Loeppert |
| 6,535,460 | B2 | 3/2003 | Loeppert et al. |
| 6,710,461 | B2 * | 3/2004 | Chou et al. ..................... 257/780 |
| 7,049,051 | B2 | 5/2006 | Gabriel et al. |
| 7,190,038 | B2 | 3/2007 | Dehe et al. |
| 7,202,101 | B2 | 4/2007 | Gabriel et al. |
| 7,202,560 | B2 * | 4/2007 | Dungan et al. ................ 257/713 |
| 7,214,995 | B2 * | 5/2007 | Chou et al. ..................... 257/415 |
| 7,492,019 | B2 * | 2/2009 | Carley .......................... 257/415 |

OTHER PUBLICATIONS

"Development of New Generation Microphone" China Academic Journal Electronic Publishing House, Process Automation Instrumentation, 1996, 17(3) pp. 1-6.

* cited by examiner

*Primary Examiner* — Julio J Maldonado
*Assistant Examiner* — Sonya D McCall Shepard
(74) *Attorney, Agent, or Firm* — Tung & Associates

(57) ABSTRACT

According to the present invention, a micro-electro-mechanical system (MEMS) device comprises: a thin film structure including at least a metal layer and a protection layer deposited in any order; and a protrusion connected under the thin film structure. A preferred thin film structure includes at least a lower protection layer, a metal layer and an upper protection layer. The MEMS device for example is a capacitive MEMS acoustical sensor.

9 Claims, 5 Drawing Sheets

MICRO-ELECTRO-MECHANICAL SYSTEM DEVICE AND METHOD FOR MAKING SAME

This is a Divisional of application Ser. No. 12/217,732, filed on Jul. 8, 2008 now U.S. Pat. No. 8,003,422.

FIELD OF THE INVENTION

The present invention relates to a micro-electro-mechanical system (MEMS) device and a method for making same, in particular to a capacitive MEMS acoustical sensor which can be manufactured by a CMOS (Complementary Metal-Oxide-Sicon) process without using an SOI (Silicon-On-Insulator) wafer, and a method for making same. The method according to the present invention produces single-chip MEMS acoustical sensors by a more robust process.

DESCRIPTION OF RELATED ART

MEMS acoustical sensors are one application of MEMS devices. Microphones of the type using MEMS acoustical sensors have become the main stream products because such MEMS acoustical sensors are small, can be mass-produced in batches, can be arranged in arrays, and can be integrated with integrated circuits. Among such MEMS acoustical sensors, capacitive MEMS acoustical sensors are the main stream products because of its high sensitivity and low parasitic noise.

In general, MEMS devices require a customized manufacturing process to meet their particular requirements of mechanical characteristics. With respect to capacitive MEMS acoustical sensors, U.S. Pat. No. 5,490,220 proposes a method for making an MEMS microphone by two wafers. Its drawback is that the manufacturing process is complicated because it requires a bonding step to bond a thin film electrode with a back-plate electrode.

U.S. Pat. No. 7,190,038 proposes a method for making an MEMS acoustical sensor. This patent uses a poly-silicon thin film electrode, a silicon dioxide sacrificial layer, and a P-doped silicon substrate as the back-plate electrode. Although poly-silicon is a material having good mechanical characteristics, it is difficult to control its film stress, and its deposition speed and thickness are limited. In the present state of the art, to deposit a low stress poly-silicon film as a mechanical structure is not a process step that can be provided by a standard CMOS process.

U.S. Pat. No. 7,049,051 proposes a method for making an MEMS microphone by a CMOS compatible process. In this method, the metal and dielectric layers deposited by CMOS process steps are used as the thin film electrode, and an isotropic etch step is performed on the silicon substrate to form the vibration chamber and the back-plate electrode. The method uses $XeF_2$ gas to isotropically etch the silicon substrate, which is difficult to accurately control the distance between the back-plate and the thin film electrode; in other words, it causes errors in the sensitivity of the acoustical sensors made thereby. Moreover, it is also difficult to define an accurate boundary of the mechanical structure of the thin film electrode.

U.S. Pat. No. 7,202,101 aims at the manufacture of the thin film structure of the MEMS microphone. In this patent, the metal layer(s) is the conductive thin film electrode, which is enclosed by a special insulating polymer material. Although the chemical vapor deposited insulating polymer material has good thin film characteristics, it is not a material offered by a standard CMOS process.

Except U.S. Pat. No. 7,049,051, none of the above-mentioned patents are compatible with CMOS process. And the MEMS device manufactured by U.S. Pat. No. 7,049,051 has the drawbacks described above. Therefore, the present invention proposes a solution.

SUMMARY OF THE INVENTION

In view of the foregoing drawbacks, it is a first objective of the present invention to provide a method for making an MEMS device which is completely compatible with a standard CMOS process without using special wafers or process steps.

It is a second objective of the present invention to provide an MEMS device; the MEMS device is, e.g., a capacitive MEMS acoustical sensors.

In accordance with the foregoing and other objectives of the present invention, and from one aspect of the present invention, a method for making an MEMS device comprises: providing a substrate; forming a dielectric layer on the substrate; forming a protrusion in the dielectric layer by a material different from that of the dielectric layer, wherein the protrusion is not in direct connection with the upper surface of the substrate; depositing a thin film structure including at least a metal layer and a protection layer; etching the back side of the substrate to form through holes; and removing a portion of the dielectric layer by etching.

In the method described above, preferably, the thin film structure includes at least a lower protection layer, a metal layer and an upper protection layer.

Also preferably, a guard ring is formed in the dielectric layer. The protrusion and the guard ring is preferably made of metal.

The upper and lower protection layers are preferably made of an insulating material, for example selected from one or more of the followings: silicon nitride, silicon oxynitride, and titanium oxide. The dielectric layer is preferably made of one or more materials selected from the followings: silicon dioxide, fluorine-doped silicon dioxide, low dielectric constant materials, and oxides.

From another aspect of the present invention, an MEMS device comprises: a thin film structure including at least a metal layer and a protection layer deposited in any order; and a protrusion connected under the thin film structure.

In the device described above, preferably, the thin film structure includes at least a lower protection layer, a metal layer and an upper protection layer.

The MEMS device for example is a capacitive MEMS acoustical sensor.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

The drawings as referred to throughout the description of the present invention are for illustration only, but not drawn according to actual scale.

Figure 1A:
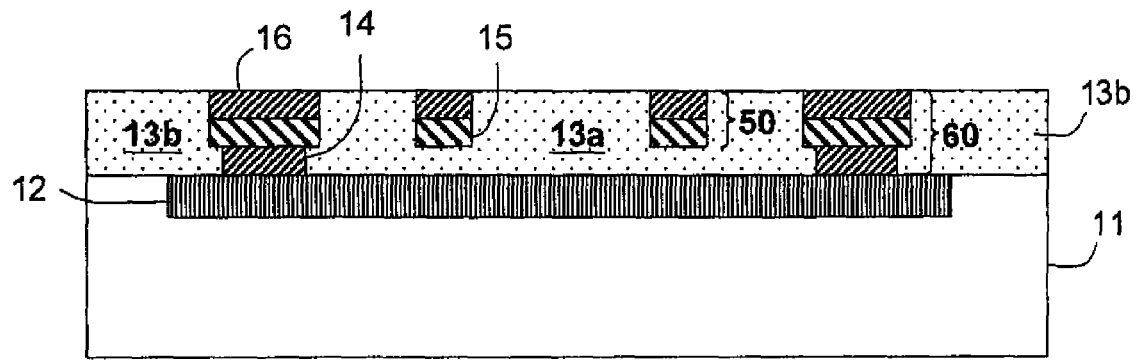
FIGS. 1A-1H is a schematic cross-sectional diagram showing an embodiment of the present invention.

Referring to FIG. 1A for an embodiment of the present invention, a zero-layer wafer substrate 11 is provided, which for example can be a silicon wafer so that the process is compatible with a standard CMOS process. Next, a doped area 12 is formed in the substrate 11, and transistor devices can be formed by standard CMOS process steps as required (not shown). And next, a structure above the substrate is formed, which includes dielectric layers 13a and 13b, a contact layer 14, a first metal layer 15, and a first via layer 16. The structure can be made by various ways. In one embodiment, a first dielectric layer is deposited and etched to form openings for the contact layer 14 to fill in. The first metal layer 15 is next deposited and patterned. A second dielectric layer is deposited and planarized; next, it is etched to form openings for the first via layer 16 to fill in. In other words, in this embodiment, the dielectric layer 13a (13b) includes two dielectric layers. In another embodiment, a damascene process is used, in which a first dielectric layer is deposited and etched to form openings for the contact layer 14 and the first metal layer 15 to fill in by one step. Next, a second dielectric layer is deposited and etched to form openings for the first via layer 16 to fill in. In this embodiment, the dielectric layer 13a (13b) also includes two dielectric layers. In yet another embodiment, depending on the layout of the overall circuit, if the first via layer 16 is not required or if the first via layer 16 has a pattern that is the same as the pattern of the first metal layer 15, the dielectric layer 13a (13b) can include only one dielectric layer and the structure shown in the figure can be formed by one damascene step.

Figure 2:
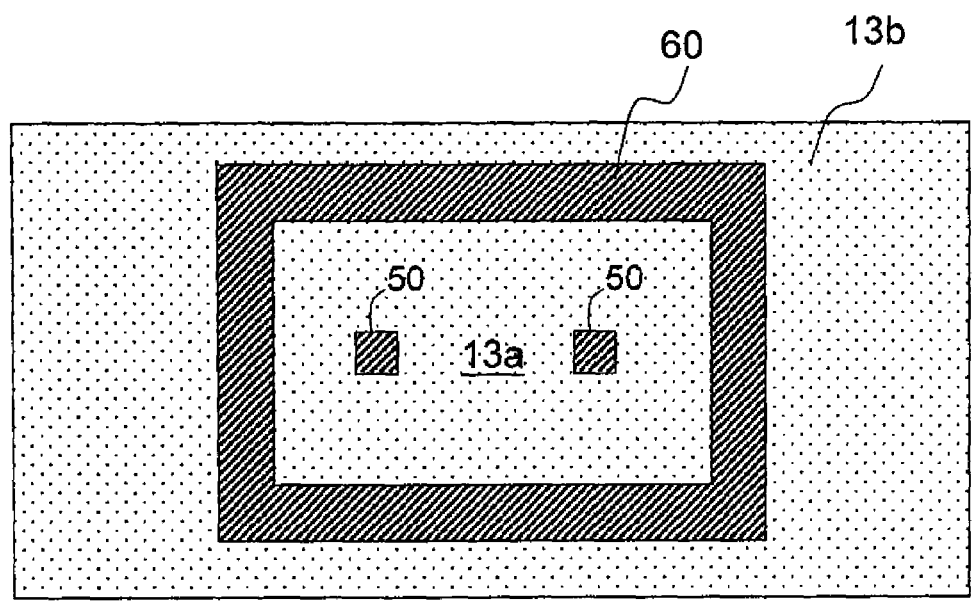
FIG. 2 shows the top view of FIG. 1A.

Referring to FIG. 1A in conjunction with the top view of FIG. 2, in the dielectric layer 13a, the first metal layer 15 and the first via layer 16 form a downward protrusion 50. The lower surface of the protrusion 50 is not in direct connection with the upper surface of the substrate 11. The number of the protrusion 50 can be arbitrarily decided; only two protrusions 50 are shown in the figure for illustration. The function of the protrusion 50 will be explained later with reference to FIG. 1H. In addition, the contact layer 14, the first metal layer 15 and the first via layer 16 form a guard ring 60 isolating the dielectric layer 13a and the dielectric layer 13b, so that the area in the dielectric layer 13b can accommodate other devices or structure (not shown). The width and thickness of the contact layer 14, the first metal layer 15 and the first via layer 16 are not drawn in the figure according to scale. They can be of any size in an actual product.

The structure shown in the figures is formed by two layers of metal. In one embodiment, the contact layer and the via layer can be made by tungsten; the metal layer can be made by aluminum; the dielectric layer can be made by oxides such as silicon dioxide, fluorine-doped silicon dioxide, and low dielectric constant materials. Of course, what is shown in the figure and described in the above is only for example. The interconnection can be made by other conductive and dielectric materials, and the structure can be formed by more layers of metal.

Figure 1B:
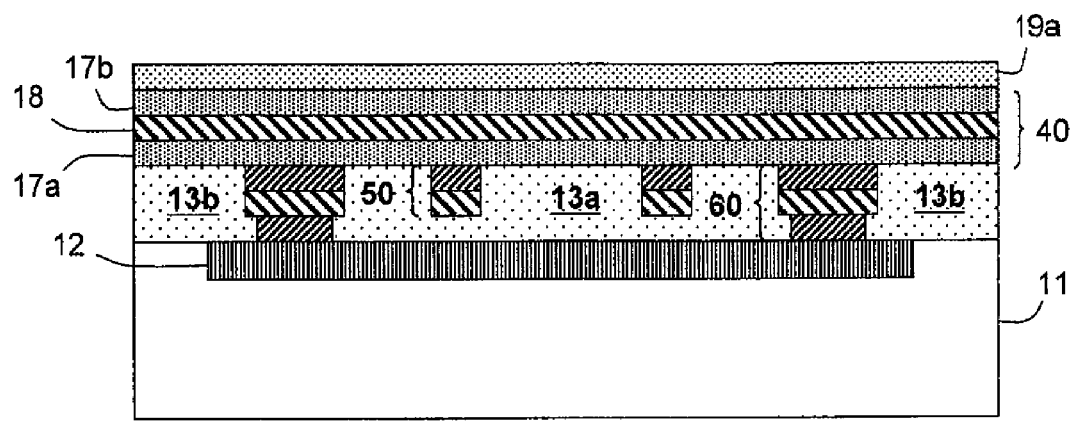

Referring to FIG. 1B, a lower protection layer 17a made of, e.g., silicon nitride or silicon oxynitride is deposited on the structure of FIG. 1A. A second metal layer 18 is deposited thereon, and an upper protection layer 17b is deposited on the second metal layer 18. The materials of the lower protection layer 17a and upper protection layer 17b can be the same or different. The function of the upper and lower protection layers is to protect the second metal layer 18, and they have to sustain etch during a later step to etch the dielectric layer 13a. Hence the protection layers can be made of any conductive or insulating material that has high selectivity during etching the dielectric layer 13a, such as but not limited to the aforementioned silicon nitride or silicon oxynitride, titanium oxide, and so on.

The protection layers 17a and 17b and the second metal layer 18 form a thin film structure 40 in the MEMS device. As an example, when the MEMS device is an acoustical sensor, the thin film structure 40 can be used to sense sonic waves and vibrates accordingly.

After the thin film structure is formed, an etch protection layer 19a, such as a photoresist layer, is deposited thereon. The etch protection layer 19a may be omitted if the upper protection layer 17b is strongly resistive to the following etch step.

Figure 1C:
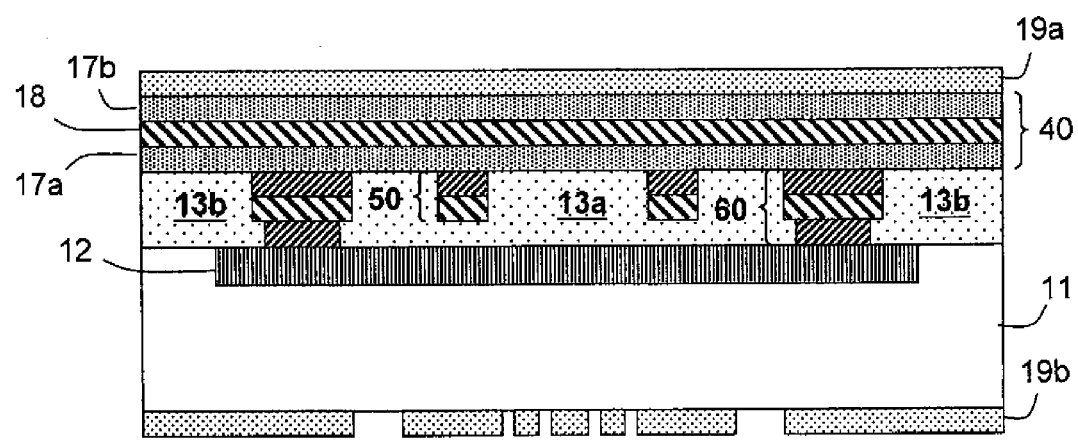

Referring to FIG. 1C, a photoresist layer 19b is coated on the backside of the substrate, and patterned.

Figure 1D:
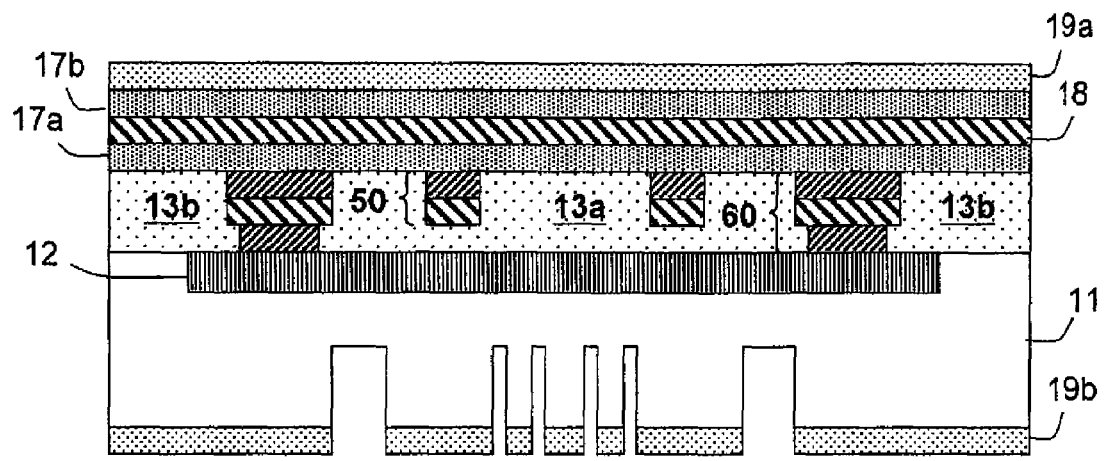

Referring to FIG. 1D, an etch step is performed from the backside of the substrate to a first depth (e.g. by time mode control) according to the pattern of the photoresist layer 19b. The etch for example can be anisotropic RIE (reactive ion etch).

Figure 1E:
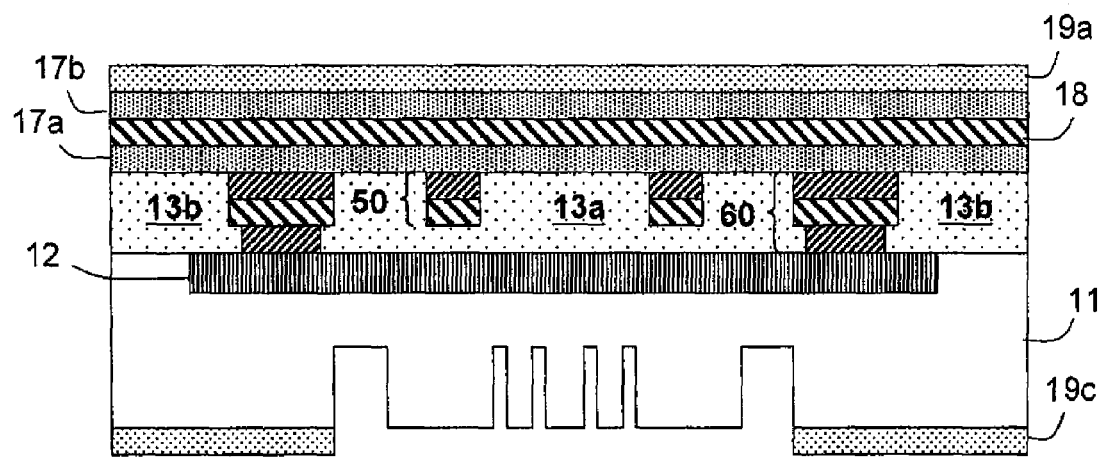
Figure 1F:
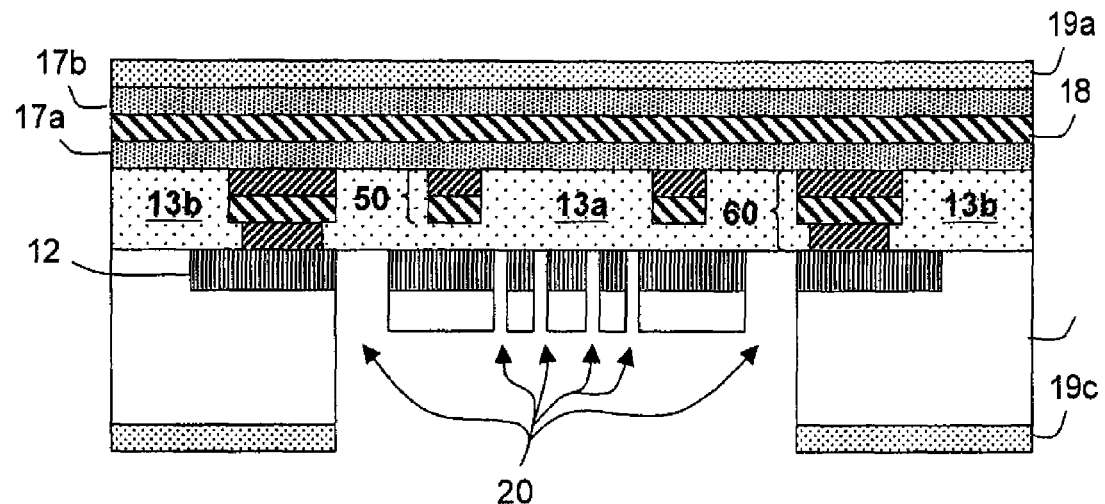

Referring to FIG. 1E, a patterned photoresist layer 19c replaces the residual photoresist layer 19b (that is, the photoresist layer 19b is removed, and a new photoresist layer 19c is coated and patterned). Next in FIG. 1F, an etch step is performed according to the pattern of the photoresist layer 19c until it reaches the dielectric region 13a. Thus, through holes 20 are formed in the substrate 11 (and the doped region 12).

Figure 1G:
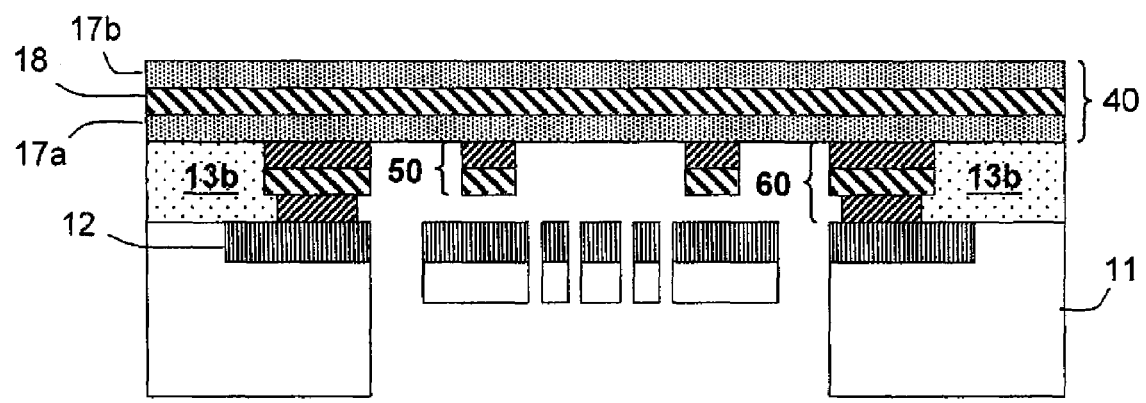

Next in FIG. 1G, an etch step is performed on the dielectric region 13a to remove it completely. The etch for example can be HF vapor etch, or BOE (buffered oxide etch) by immersing the whole wafer in an acid tank. The etch protection layer 19a and the photoresist layer 19c can be removed after or before this etch step.

Figure 1H:
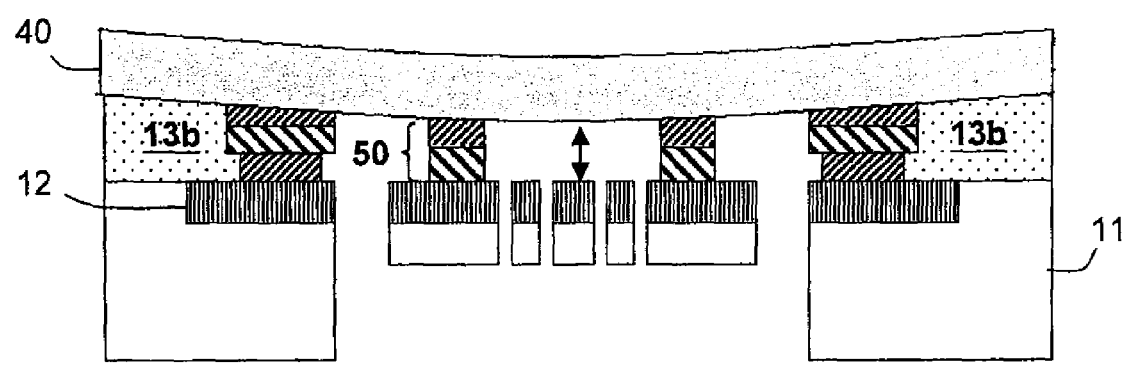

Referring to FIG. 1H, in addition to overcoming the drawbacks of prior art (incompatibleness with CMOS process and difficulty in controlling the thin film structure accurately), the present invention is further superior to the prior art in the following aspect. After the region 13a is removed and the thin film structure 40 is suspended, the thin film structure 40 may stick to the substrate 11 and render the whole MEMS device inoperative. The protrusion 50 according to this invention greatly reduces the possible contact area between the thin film structure 40 and the substrate 11, and reduces the surface tension effect so that the thin film structure 40 can be suspended and function normally.

Although the present invention has been described in detail with reference to certain preferred embodiment thereof, the description is for illustrative purpose and not for limiting the scope of the invention. For example, the present invention can use a process of more than two layers of metal; there can be more than one layer of metal under the thin film structure 40, or above the thin film structure 40. The number of layers of the protrusion 50 can be correspondingly changed, or kept unchanged. The thin film structure 40 is not limited to the tri-layer structure as shown; it can include only one metal layer and one protection layer (in any order) or total more than three metal layer(s) and protection layer(s), in any order. One skilled in this art can readily think of any modifications and variations in light of the teaching by the present invention. In view of the foregoing, it is intended that the present invention cover all such modifications and variations, which should interpreted to fall within the scope of the following claims and their equivalents.

What is claimed is:

1. A micro-electro-mechanical system (MEMS) device, comprising:
    a thin film structure including at least a metal layer and a protection layer deposited in any order; and
    a protrusion connected under the thin film structure, wherein the protrusion is not in contact with a lower layer below the protrusion when the thin film structure is not deformed, and wherein the protrusion includes a metal layer and a via layer.

2. A micro-electro-mechanical system (MEMS) device, comprising:
    a thin film structure including at least a metal layer and a protection layer deposited in any order;
    a protrusion connected under the thin film structure, wherein the protrusion is not in contact with a lower layer below the protrusion when the thin film structure is not deformed; and
    a guard ring under the thin film structure.

3. The MEMS device of claim 2, wherein the guard ring is made of metal.

4. The MEMS device of claim 2, wherein the guard ring includes a contact layer, a metal layer and a via layer.

5. A micro-electro-mechanical system (MEMS) device, comprising:
    a thin film structure including at least a metal layer and a protection layer deposited in any order, wherein the protection layer is made of an insulating material; and
    a protrusion connected under the thin film structure, wherein the protrusion is not in contact with a lower layer below the protrusion when the thin film structure is not deformed.

6. The MEMS device of claim 5, wherein the protection layer is made of one or more materials selected from the followings: silicon nitride, silicon oxynitride, and titanium oxide.

7. A micro-electro-mechanical system (MEMS) device, comprising:
    a thin film structure including at least a metal layer and a protection layer deposited in any order; and
    a protrusion connected under the thin film structure, wherein the protrusion is not in contact with a lower layer below the protrusion when the thin film structure is not deformed, wherein the MEMS device is an acoustical sensor.

8. A micro-electro-mechanical system (MEMS) device, comprising:
    a thin film structure including at least a lower protection layer, a metal layer and an upper protection layer; and
    a protrusion connected under the thin film structure, wherein the protrusion is not in contact with a lower layer below the protrusion when the thin film structure is not deformed.

9. A micro-electro-mechanical system (MEMS) device, comprising:
    a thin film structure including at least a metal layer and a protection layer deposited in any order;
    a protrusion connected under the thin film structure; and
    a guard ring under the thin film structure, wherein the guard ring includes a contact layer, a metal layer and a via layer.

* * * * *